United States Patent
Nosaka

(10) Patent No.: US 9,509,279 B2
(45) Date of Patent: Nov. 29, 2016

(54) ELASTIC WAVE FILTER WITH MAGNETICALLY COUPLED LC PARALLEL RESONANCE CIRCUITS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/682,184

(22) Filed: Apr. 9, 2015

(65) Prior Publication Data
US 2015/0222246 A1 Aug. 6, 2015

Related U.S. Application Data

(63) Continuation of application No. PCT/JP2013/071551, filed on Aug. 8, 2013.

(30) Foreign Application Priority Data

Oct. 24, 2012 (JP) .................................. 2012-234960

(51) Int. Cl.
*H03H 9/54* (2006.01)
*H03H 9/64* (2006.01)
(Continued)

(52) U.S. Cl.
CPC ........... *H03H 9/542* (2013.01); *H03H 9/6423* (2013.01); *H03H 9/6483* (2013.01); *H03H 7/09* (2013.01); *H03H 7/1775* (2013.01)

(58) Field of Classification Search
CPC ...... H03H 7/09; H03H 9/725; H03H 7/1775; H03H 9/542; H03H 9/6483; H03H 9/6423

USPC ........ 333/133, 175, 185, 187, 188, 193–196
See application file for complete search history.

(56) References Cited

U.S. PATENT DOCUMENTS

| | | | |
|---|---|---|---|
| 7,061,345 B2 * | 6/2006 | Misu | H03H 7/0115 333/186 |
| 2006/0284705 A1 * | 12/2006 | Kamgaing | H03H 7/0161 333/175 |

(Continued)

FOREIGN PATENT DOCUMENTS

| | | |
|---|---|---|
| JP | 55-156414 A | 12/1980 |
| JP | 62-216515 A | 9/1987 |

(Continued)

OTHER PUBLICATIONS

Machine English Translation of JP2011234191A, published on Nov. 17, 2011.*

(Continued)

*Primary Examiner* — Barbara Summons
*Assistant Examiner* — Jorge Salazar, Jr.
(74) *Attorney, Agent, or Firm* — Keating & Bennett, LLP

(57) ABSTRACT

A filter device includes a first LC parallel resonance circuit having a first inductance and connected between a line connecting an input terminal and an output terminal and a ground potential, a second LC parallel resonance circuit having a second inductance and connected between the line and the ground potential, and at least one elastic wave resonator that is connected between an end portion of the first LC parallel resonance circuit and an end portion of the second LC parallel resonance circuit. Attenuation-frequency characteristics of an LC filter including the first LC parallel resonance circuit, the second LC parallel resonance circuit, and a capacitive property and attenuation-frequency characteristics of the at least one elastic wave resonator are used.

21 Claims, 10 Drawing Sheets

(51) Int. Cl.
 *H03H 7/09* (2006.01)
 *H03H 7/01* (2006.01)

(56) References Cited

U.S. PATENT DOCUMENTS

| 2007/0030096 A1 | 2/2007 | Nishihara et al. | |
|---|---|---|---|
| 2012/0119848 A1* | 5/2012 | Liu | H03H 9/0095 333/187 |
| 2012/0313726 A1 | 12/2012 | Ueda et al. | |

FOREIGN PATENT DOCUMENTS

| JP | 63-18709 A | 1/1988 | |
|---|---|---|---|
| JP | 4-284606 A | 10/1992 | |
| JP | 6-350374 A | 12/1994 | |
| JP | H09321573 | * 12/1997 | H03H 9/25 |
| JP | 2003-243966 A | 8/2003 | |
| JP | 2004-007250 A | 1/2004 | |
| JP | 2007-074698 A | 3/2007 | |
| JP | 2007-202136 A | 8/2007 | |
| JP | 2008-312146 A | 12/2008 | |
| JP | 2009-218756 A | 9/2009 | |
| JP | 2011-176746 A | 9/2011 | |
| JP | 2011-234191 A | 11/2011 | |
| WO | 2011/105315 A1 | 9/2011 | |

OTHER PUBLICATIONS

Machine English Translation of JPH09321573, published on Dec. 12, 1997.*
Official Communication issued in corresponding Japanese Patent Application No. 2014-543169, mailed on Nov. 4, 2015.
Official Communication issued in International Patent Application No. PCT/JP2013/071551, mailed on Oct. 29, 2013.
Official Communication issued in corresponding European Patent Application No. 13848772.3, mailed on May 3, 2016.
Novgorodov, V. et al., "Modified Ladder-Type 2.4GHz SAW Filter with Transmission Zero", IEEE Ultrasonics Symposium, Oct. 11, 2010, pp. 2083-2086.

* cited by examiner

ELASTIC WAVE FILTER WITH MAGNETICALLY COUPLED LC PARALLEL RESONANCE CIRCUITS

BACKGROUND OF THE INVENTION

1. Field of the Invention

The present invention relates to a band pass filter device, more specifically, relates to a filter device including an LC parallel resonance circuit and an elastic wave resonator.

2. Description of the Related Art

Various existing filter devices have been proposed as band pass filters for mobile communication devices and the like. A pass band of the filter device of this type is required to be wide in many cases.

Japanese Unexamined Patent Application Publication No. 2011-234191 discloses a band pass filter device capable of widening a pass band. In the band pass filter device as disclosed in Japanese Unexamined Patent Application Publication No. 2011-234191, a high pass filter circuit and a low pass filter circuit are connected in series. The high pass filter circuit includes a high pass surface acoustic wave resonator and a high pass inductance element that is connected in parallel with the high pass surface acoustic wave resonator. On the other hand, the low pass filter circuit includes a first surface acoustic wave resonator that is arranged on a serial arm and one end of which is connected to an end portion of the high-pass filter circuit.

A second surface acoustic wave resonator is connected between the one end of the first surface acoustic wave resonator and a ground potential and a low pass inductance element is connected in parallel with the second elastic wave resonator. Further, the second surface acoustic wave resonator is also connected between the other end of the above-mentioned first surface acoustic wave resonator and the ground potential. A low pass inductance element is also connected in parallel with the second surface acoustic wave resonator.

Japanese Unexamined Patent Application Publication No. 2007-202136 discloses a surface acoustic wave (SAW) filter having a wide pass band in a digital terrestrial television (TV) radio wave band. In the SAW filter as disclosed in Japanese Unexamined Patent Application Publication No. 2007-202136, two serial arm resonators are provided on a serial arm connecting an input terminal and an output terminal. Inductance for shifting resonant frequency/anti-resonant frequency is connected between the two serial arm resonators in series to the two serial arm resonators.

Further, a parallel arm resonator is arranged on a parallel arm connecting the input terminal and a ground potential. An inductance element is connected in parallel with the parallel arm resonator. In the same manner, a parallel arm resonator is also provided on a parallel arm connecting the output terminal and the ground potential. An inductance element is also connected in parallel with the parallel arm resonator.

The inductance element connected to each of the above-mentioned parallel arm resonators is provided for shifting a resonant frequency and an anti-resonant frequency by the parallel arm resonator.

In Japanese Unexamined Patent Application Publication No. 2011-234191 and Japanese Unexamined Patent Application Publication No. 2007-202136, as described above, the resonant frequency or the anti-resonant frequency of the surface acoustic wave resonator arranged on a line connecting the input terminal and the output terminal, in other words, the serial arm, or of the surface acoustic wave resonator arranged on the parallel arm connecting the line and the ground potential, can be adjusted. This adjustment widens the band, improves attenuation characteristics, and so on.

It has been, however, difficult to further widen the pass band with the band pass filter using the surface acoustic wave resonator. For example, in a ladder circuit, the resonant frequency of the parallel arm resonator and the anti-resonant frequency of the serial arm resonator form attenuation poles at the low-frequency region side and the high-frequency region side. Accordingly, it is sufficient that they are distanced from each other in order to widen the band. However, when a difference in frequency between the attenuation pole at the low-frequency region side and the attenuation pole at the high-frequency region side is made larger, there arises a problem that attenuation at the center of the pass band is increased. Accordingly, widening of the band has been limiting.

In addition, the ladder filter device also has a problem that attenuation in an attenuation band separated from the attenuation pole is not sufficiently large.

SUMMARY OF THE INVENTION

Preferred embodiments of the present invention provide a filter device capable of further widening a band and sufficiently increasing attenuation in an attenuation region separated from a pass band.

According to an aspect of various preferred embodiments of the present invention, a filter device includes an input terminal, an output terminal, a line connecting the input terminal and the output terminal, a first LC parallel resonance circuit connected between the line and a ground potential and including a first inductance, a second LC parallel resonance circuit connected between the line and the ground potential and including a second inductance, and at least one elastic wave resonator connected between an end portion of the first LC parallel resonance circuit at the line side and an end portion of the second LC parallel resonance circuit at the line side. In the filter device, the first and second LC parallel resonance circuits are electrically coupled by a capacitive property of the at least one elastic wave resonator, and attenuation-frequency characteristics of an LC filter including the first and second LC parallel resonance circuits and the capacitive property of the at least one elastic wave resonator and attenuation-frequency characteristics defined by an anti-resonance point of the elastic wave resonator are combined.

According to another broad aspect of various preferred embodiments of the present invention, a filter device includes an input terminal, an output terminal, a line connected to the input terminal and the output terminal, a first LC parallel resonance circuit connected between the line and a ground potential, including a first inductance, and having a first parallel resonant frequency, a second LC parallel resonance circuit connected between the line and the ground potential, including a second inductance, and having a second parallel resonant frequency, and a filter circuit including at least one elastic wave resonator connected to an end portion of the first LC parallel resonance circuit at the line side and an end portion of the second LC parallel resonance circuit at the line side. In the filter device, first resonance characteristics of the first LC parallel resonance circuit, second resonance characteristics of the second LC parallel resonance circuit, and a capacitive property of the at least one elastic wave resonator cause the first and second resonance characteristics to be electrically coupled so as to provide pass band characteristics of an LC filter. Further, a pass band of the LC filter is arranged in a frequency region that is lower than an anti-resonant frequency of the at least one elastic wave resonator or higher than a resonant frequency thereof, the first parallel resonant frequency and the second parallel resonant frequency are arranged in the pass band of the LC filter, and an attenuation pole of the filter circuit including the at least one elastic wave resonator is arranged in an attenuation region at an outside of the pass band of the LC filter.

In a specific aspect of the filter device according to various preferred embodiments of the present invention, the first inductance in the first LC parallel resonance circuit and the second inductance in the second LC parallel resonance circuit are magnetically coupled.

In another specific aspect of the filter device according to various preferred embodiments of the present invention, the at least one elastic wave resonator connected between the first LC parallel resonance circuit and the second LC parallel resonance circuit includes a plurality of elastic wave resonators and the plurality of elastic wave resonators configure a ladder filter circuit.

In still another specific aspect of the filter device according various preferred embodiments of the present the invention, the first and second LC parallel resonance circuits are respectively defined by the first and second inductances and second and third elastic wave resonators connected in parallel with the first and second inductances, and capacitive properties of the second and third elastic wave resonators configure capacitors of the first and second LC parallel resonance circuits, respectively.

In another specific aspect of the filter device according to various preferred embodiments of the present invention, a circuit portion in which the first inductance in the first LC parallel resonance circuit and the second inductance in the second LC parallel resonance circuit are magnetically coupled is configured by a circuit with a delta-shaped configuration including the first inductance, the second inductance, and a third inductance connecting one end of the first inductance and one end of the second inductance.

In still another specific aspect of the filter device according to various preferred embodiments of the present invention, a circuit portion in which the first inductance in the first LC parallel resonance circuit and the second inductance in the second LC parallel resonance circuit are magnetically coupled is configured by a three-element Y type circuit including a common inductance defining and serving as the first inductance and the second inductance, a fourth inductance connected to a connection point between an end portion of the common inductance at a side opposite to a ground potential and the input terminal, and a fifth inductance connected between the connection point and the output terminal.

In still another specific aspect of the filter device according to various preferred embodiments of the present invention, each of the first inductance and the second inductance in the first and second LC parallel resonance circuits is divided in series into a plurality of inductances.

In still another specific aspect of the filter device according to various preferred embodiments of the present invention, each of the first and second capacitors in the first LC parallel resonance circuit and the second LC parallel resonance circuit includes a plurality of elastic wave resonators connected in series.

In still another specific aspect of the filter device according to various preferred embodiments of the present invention, a sixth inductance is connected between an ground potential and an end portion of at least one LC parallel resonance circuit of the first and second LC parallel resonance circuits at the ground potential side.

In the filter device according to various preferred embodiments of the present invention, a surface acoustic wave resonator is preferably used as the above-mentioned elastic wave resonator, for example. However, the elastic wave resonator may be a resonator configured to use bulk acoustic waves, for example. Further, a boundary acoustic wave resonator using boundary acoustic waves may be used.

With the filter devices according to various preferred embodiments of the present invention, a wide pass band is obtained and attenuation in an attenuation band separated from the pass band is sufficiently increased. Further, attenuation in the vicinity of the pass band is sufficiently increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A(a) is a graph illustrating attenuation-frequency characteristics of an existing LC filter when an elastic wave resonator 21 is taken as a capacitor and attenuation-frequency characteristics of the elastic wave resonator, FIG. 2A(b) is a graph illustrating attenuation-frequency characteristics of the filter device in the first preferred embodiment of the present invention, and FIG. 2A(c) is a graph illustrating attenuation-frequency characteristics when negative magnetic coupling occurs in the filter device in the first preferred embodiment of the present invention.

DETAILED DESCRIPTION OF THE PREFERRED EMBODIMENTS

Hereinafter, preferred embodiments of the present invention are described with reference to the drawings.

Figure 1A:
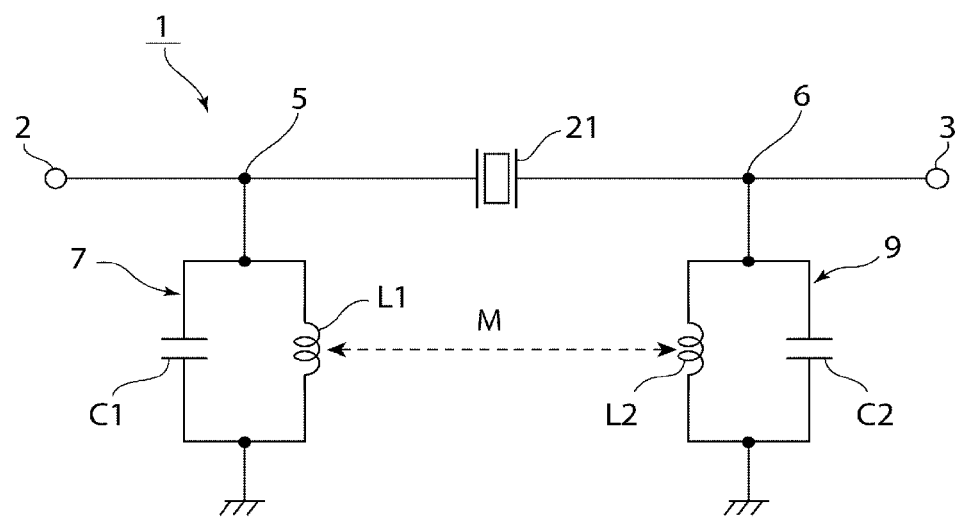
FIG. 1A and FIG. 1B are a circuit diagram of a filter device according to a first preferred embodiment of the present invention and a schematic plan view of an electrode configuration of a surface acoustic wave resonator, respectively.

FIG. 1A is a circuit diagram of a filter device according to a first preferred embodiment of the present invention.

A filter device 1 includes an input terminal 2 and an output terminal 3. A first LC parallel resonance circuit 7 is connected between a connection point 5 between the input terminal 2 and an elastic wave resonator 21 and a ground potential. The first LC parallel resonance circuit 7 includes an inductance L1 and a capacitor C1 connected in parallel with the inductance L1.

A second LC parallel resonance circuit 9 is connected between a connection point 6 between the output terminal 3 and the elastic wave resonator 21 and the ground potential. The second LC parallel resonance circuit 9 includes an inductance L2 and a capacitor C2 connected in parallel with the inductance L2.

The elastic wave resonator 21 is connected between an end portion of the first LC parallel resonance circuit 7 at the input terminal 2 side and an end portion of the second LC parallel resonance circuit 9 at the output terminal 3 side so as to provide a filter circuit. In the present preferred embodiment, one elastic wave resonator 21 is connected. Resonance points of the first and second LC parallel resonance circuits are set to be close to the center frequency of a pass band of the filter device 1.

Not one but a plurality of elastic wave resonators may be connected. In this case, a connection mode of the plurality of elastic wave resonators is not particularly limited.

Figure 1B:
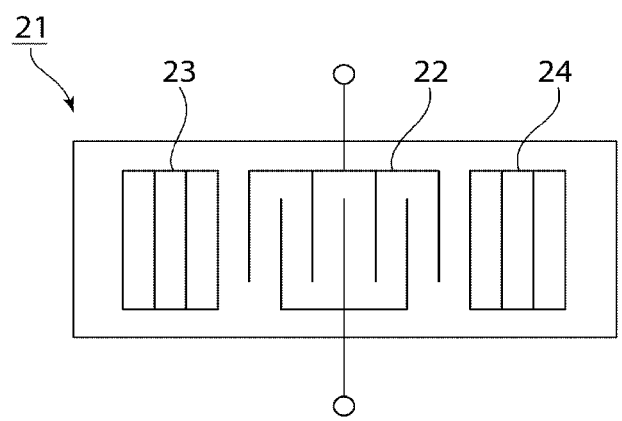

In the present preferred embodiment, the elastic wave resonator 21 preferably is a surface acoustic wave resonator. FIG. 1B schematically illustrates an electrode configuration of the elastic wave resonator 21 defined by the surface acoustic wave resonator. The elastic wave resonator 21 includes an interdigital transducer (IDT) electrode 22 and reflectors 23 and arranged at both sides of the IDT electrode 22 in a propagation direction of the surface acoustic waves. Although the electrode configuration of the elastic wave resonator 21 is not particularly limited, a normal one-port surface acoustic wave resonator like this one can be preferably used therefor. It should be noted that the reflectors 23 and 24 can be omitted in accordance with a characteristic request for the one-port surface acoustic wave resonator.

Preferably, it is desired that the above-mentioned inductance L1 and inductance L2 are magnetically coupled as indicated by a dashed line M in FIG. 1A. The magnetic coupling makes the circuit equivalent to a circuit in which the magnetically coupled inductance is connected to the line connected to the input terminal 2 and the output terminal 3. That is to say, the circuit becomes equivalent to a circuit in which the inductance equivalent in the circuit as described above is connected in parallel with the elastic wave resonator 21. Accordingly, the magnetic coupling makes the circuit equivalent to a circuit in which an LC parallel resonance circuit is configured in frequency regions where the elastic wave resonator 21 mainly operates to exhibit a capacitive property. The frequency regions where the elastic wave resonator mainly operates to exhibit the capacitive property are frequency regions other than the resonant frequency and the anti-resonant frequency of the elastic wave resonator and a frequency region between the resonant frequency and the anti-resonant frequency of the elastic wave resonator. In the frequency regions where the elastic wave resonator 21 mainly operates to exhibit the capacitive property, the above-mentioned LC parallel resonance circuit is configured, so that as indicated by a dashed line A1 in FIG. 5C or a dashed line A2 in FIG. 5D, an attenuation pole by the resonant frequency by the LC parallel resonance circuit is provided in an attenuation region part separated from the pass band. Accordingly, the attenuation in the attenuation region separated from the pass band is further increased.

Widening of the band, increase of the attenuation in the vicinity of the pass band, and increase of the attenuation in the attenuation region separated from the pass band that are achieved by the filter device 1 according to a preferred embodiment of the present invention, are described with reference to FIG. 2 and FIG. 2A.

Figure 2A:
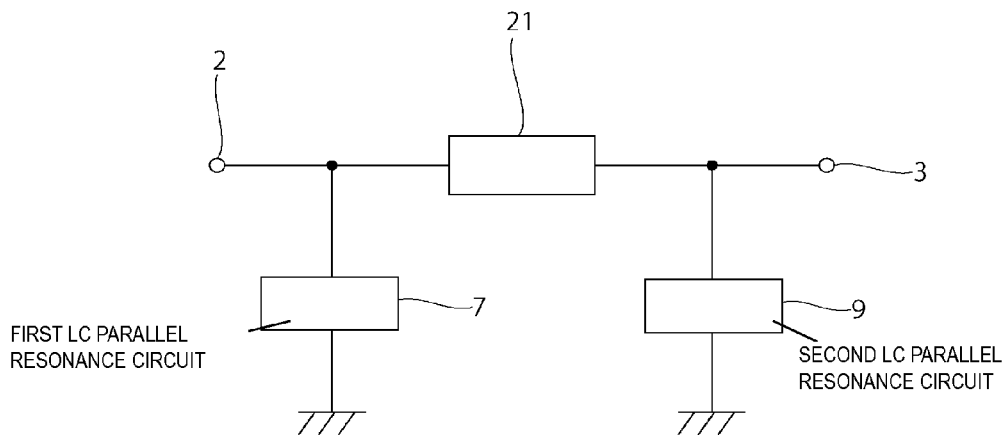
FIG. 2A is a schematic block diagram of the filter device in the first preferred embodiment of the present invention.

FIG. 2A is a schematic block diagram of the filter device according to the first preferred embodiment as illustrated in FIGS. 1A and 1B. As illustrated in the schematic block diagram, the first LC parallel resonance circuit 7 is connected between the line connecting the input terminal 2 and the output terminal 3 and the ground potential. The second LC parallel resonance circuit 9 is connected between the ground potential and the line connecting the input terminal 2 and the output terminal 3 at the output terminal 3 side relative to the first LC parallel resonance circuit 7. The elastic wave resonator 21 is connected between the connection points at which the first LC parallel resonance circuit 7 and the second LC parallel resonance circuit 9 are respectively connected to the line.

Figure 2B:
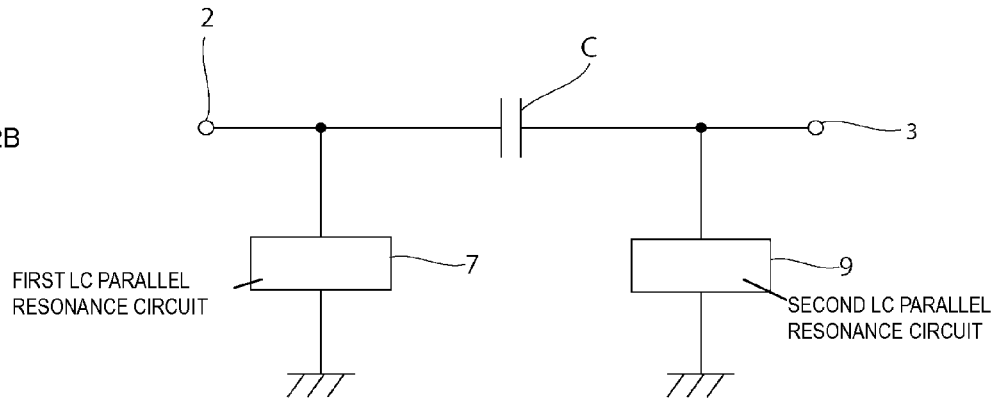
FIG. 2B is a schematic block diagram when the filter device in the first preferred embodiment of the present invention operates as an LC filter.

As the frequency characteristics of the elastic wave resonator 21, the elastic wave resonator 21 mainly exhibits an inductive property in the frequency region between the resonant frequency and the anti-resonant frequency and mainly exhibits a capacitive property in a frequency region lower than the resonant frequency and in a frequency region higher than the anti-resonant frequency. Accordingly, in the frequency regions where the elastic wave resonator 21 exhibits the capacitive property, the block diagram of the filter device 1 corresponds to FIG. 2B. That is to say, in the frequency regions where the elastic wave resonator 21 mainly exhibits the capacitive property, an LC filter in which the first and second LC parallel resonance circuits 7 and 9 and a capacitor C are connected as illustrated in FIG. 2B is configured. A solid line in FIG. 2A(a) indicates attenuation-frequency characteristics of the above-mentioned LC filter. In the LC filter, a pass band wider than that of a ladder filter using a plurality of surface acoustic wave resonators is obtained. That is to say, even when the pass band is widened by adjusting values of the inductances and the capacitor, it is difficult to increase the attenuation at the center of the pass band.

As indicated by the solid line in FIG. 2A(a), inclinations of the attenuation characteristics from the pass band toward the outsides of the pass band are moderate in the LC filter.

In the present preferred embodiment, the above-mentioned elastic wave resonator 21 is provided. The resonant frequency of the elastic wave resonator 21 is within the pass band of the filter device 1 as described above. The anti-resonant frequency thereof is located at a portion on which the attenuation is desired to be increased, to be more specific, in the vicinity of the pass band and within the attenuation region at the high-frequency region side relative to the pass band.

Figure 2C:
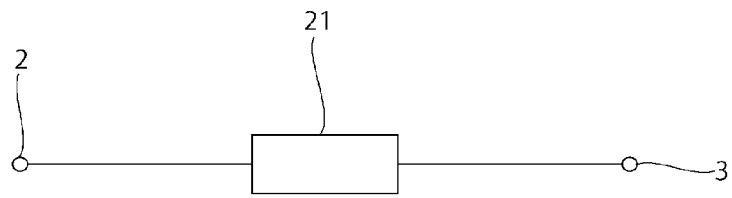
FIG. 2C is a schematic block diagram when an elastic wave resonator arranged on a line connecting an input terminal and an output terminal of the filter device in the first preferred embodiment of the present invention operates.
Figure 2A:
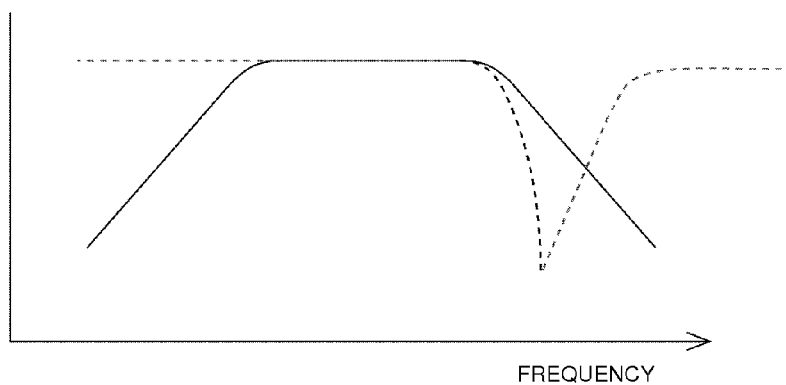
Figure 2A:
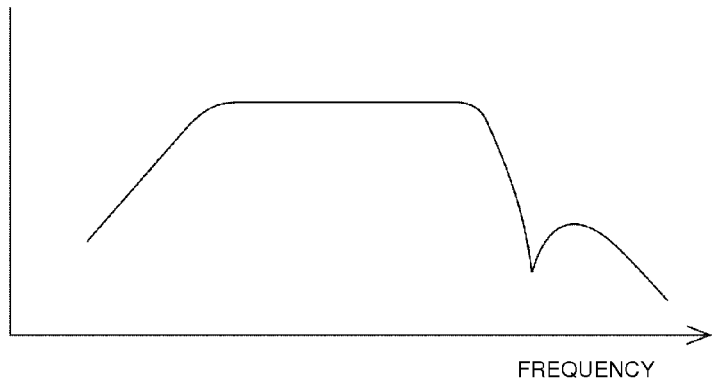
Figure 2A:
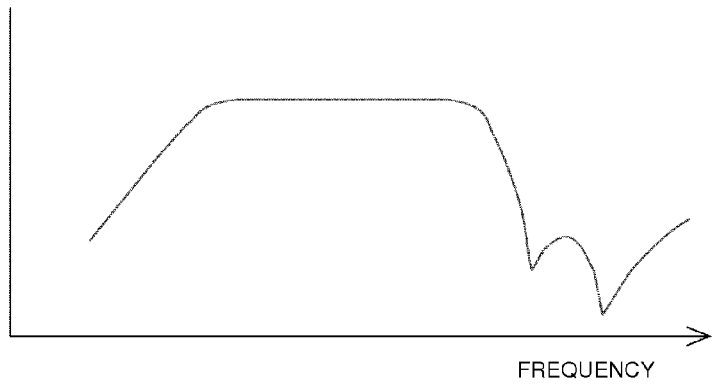

On the other hand, the above-mentioned elastic wave resonator 21 mainly exhibits the inductive property between the resonant frequency and the anti-resonant frequency. The attenuation-frequency characteristics as indicated by a dashed line in FIG. 2A(a) are characteristics in a frequency region including therein the resonant frequency and the anti-resonant frequency of the elastic wave resonator 21. The filter device 1 in the present preferred embodiment in which the LC filter and the elastic resonator 21 are combined using the above-mentioned frequency characteristics has attenuation-frequency characteristics including the attenuation-frequency characteristics as indicated by the solid line in FIG. 2A(a) and the attenuation-frequency characteristics as indicated by the dashed line in FIG. 2A(a) in combination. Accordingly, the attenuation-frequency characteristics of the filter device 1 in the present preferred embodiment as illustrated in FIG. 2A(b) are obtained. That is to say, the attenuation-frequency characteristics of the above-mentioned elastic wave resonator 21 connected between the input terminal 2 and the output terminal 3 are used, which defines and serves as a filter circuit as illustrated in FIG. 2C, which is configured such that it has the anti-resonant frequency as indicated by the dashed line in FIG. 2A(a) and the attenuation changes in accordance with a predetermined frequency as illustrated in FIG. 2A(b).

In the present preferred embodiment, the attenuation characteristics of the LC filter in which the LC parallel resonance circuits are configured are steeper than the attenuation characteristics of the LC filter as indicated by the solid line in FIG. 2A(a) by the filter characteristics of the elastic wave resonator 21, which makes use of resonance by elastic waves, that change including the anti-resonance point in accordance with the predetermined frequency. Accordingly, in the filter device 1, the attenuation characteristics at the high-frequency side of the pass band are steep as illustrated in FIG. 2A(b). Further, the attenuation in the attenuation region in the vicinity of the pass band is increased due to impedance characteristics at the anti-resonant frequency of the elastic wave resonator 21.

In addition, as evidenced by a portion indicated by the dashed line in FIG. 2A(a), if the frequency of the elastic wave resonator 21 is further shifted toward the high-frequency region side relative to the anti-resonant frequency at which the attenuation pole is provided, the attenuation of the elastic wave resonator 21 is decreased. This raises a problem that the attenuation in the attenuation region separated from the pass band is not sufficiently increased in the ladder filter and the like including the elastic wave resonator. In contrast, because the filter characteristics of the above-mentioned LC filter are used in the present preferred embodiment, the attenuation in the attenuation region separated from the pass band is increased. With the filter characteristics of the LC filter, the attenuation is large in the attenuation region separated from the pass band. Accordingly, in the present preferred embodiment, the attenuation in the attenuation band separated from the pass band is also increased.

It is sufficient that a relationship between a minimum signal intensity A in a predetermined frequency band of the filter device and a signal intensity B continuous to the signal intensity A is set as follows. That is, a frequency region in which a calculation result of $10 \log_{10} B/A$ is higher than $-3$ [dB] is taken as the pass band and a frequency region in which the calculation result of $10 \log_{10} B/A$ is equal to or lower than $-3$ [dB] is taken as the attenuation band. The signal intensity can be calculated from a voltage value of the filter device.

As described above, the filter device 1 in the present preferred embodiment preferably has a configuration capable of widening the pass band and enlarging the attenuation band separated from the pass band by the LC filter, and increasing the attenuation in the vicinity of the pass band using the elastic wave resonator 21. That is to say, the filter device 1 in the present preferred embodiment has a configuration capable of utilizing both the advantages of the characteristics of the LC filter and the elastic wave resonator while they are not obstructed by each other.

In the above-mentioned preferred embodiment, an anti-resonant frequency fa of the elastic wave resonator 21 is located at the high-frequency side relative to an end portion of the pass band defined by the LC filter at the high-frequency region side. With this, the attenuation characteristics at the high-frequency region side of the pass band are drastically steepened. Thus, in order to drastically steepen the attenuation characteristics at the high-frequency region side of the pass band, it is sufficient that the anti-resonant frequency fa is set to a position at which the attenuation pole is desired to be located to provide the attenuation pole in the vicinity of the end portion of the pass band at the high-frequency region side. In other words, when fa>fh>f0 is satisfied (note that fh is a frequency at the end portion of the pass band at the high-frequency region side and f0 is the center frequency of the pass band formed by the LC filter), the characteristics at the high-frequency region side of the pass band are drastically steepened.

When the center frequencies of the pass bands of the LC resonance circuits, which correspond to the first LC resonant frequency of the first LC parallel resonance circuit 7 and the second LC resonant frequency of the second LC parallel resonance circuit 9, are set to f1 and f2, respectively, it is preferable for f0, f1, and f2 to be close to one another, and it is also preferable to be f0=f1=f2. The center frequency f1 and the center frequency f2 are not necessarily equal to each other.

Unlike the above-mentioned case, in order to drastically steepen the attenuation characteristics at the low-frequency region side of the pass band, it is sufficient that the anti-resonant frequency fa of the elastic wave resonator 21 is located in the attenuation band in the vicinity of the end portion of the pass band at the low-frequency region side. With this, the attenuation characteristics in the attenuation region in the vicinity of the pass band at the low-frequency region side are drastically steepened. In this case, it is sufficient that the anti-resonant frequency fa is lower than f1 (frequency of the end portion of the pass band at the low-frequency region side).

In the LC parallel resonance circuit as illustrated in FIG. 1A, when predetermined magnetic coupling is defined by the first inductor L1 and the second inductor L2, an attenuation pole is generated at an outside of the pass band at the high-frequency region side as illustrated in FIG. 2A(c) and the attenuation is increased. The filter characteristics with the magnetic coupling that occurs in the filter device 1 can be replaced by the filter characteristics of a circuit in which an equivalent inductor is connected in parallel with the filter circuit. It is considered that the attenuation pole generated by LC parallel resonance by the equivalent inductor and the capacitive property of the elastic wave resonator increase the attenuation at the outside of the pass band at the high-frequency region side as illustrated in FIG. 2A(c).

Figure 3:
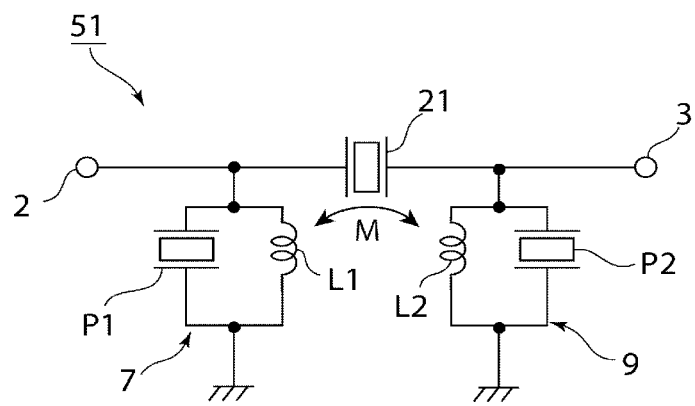
FIG. 3 is a circuit diagram of a filter device according to a second preferred embodiment of the present invention.

FIG. 3 is a circuit diagram of a filter device according to a second preferred embodiment of the present invention. As in the filter device 1 in the first preferred embodiment, a filter device 51 includes the first LC parallel resonance circuit 7, the second LC parallel resonance circuit 9, and the elastic wave resonator 21.

A different point is that second and third elastic wave resonators P1 and P2 are used instead of the capacitors C1 and C2 in the first preferred embodiment, respectively. The resonant frequencies of the elastic wave resonators P1 and P2 are at the low-frequency region side of the pass band and the anti-resonant frequencies thereof are within the pass band. The elastic wave resonators P1 and P2 and the elastic wave resonator mainly operate to exhibit a capacitive property in a frequency band at the low-frequency region side relative to the resonant frequency and a frequency band at the high-frequency region side relative to the anti-resonant frequency. Accordingly, also in the present preferred embodiment, the filter characteristics of the LC filter by the first and second LC parallel resonance circuits 7 and 9 are obtained in the frequency bands other than those between the resonant frequencies and the anti-resonant frequencies of the elastic wave resonators P1 and P2. In addition, the filter characteristics by the elastic wave resonators P1, P2, and 21 are obtained at the same time. Therefore, as in the first preferred embodiment, 1) widening of the band, 2) increase of the attenuation in the vicinity of the pass band, and 3) increase of the attenuation in the attenuation band separated from the pass band are achieved. Also in the second preferred embodiment, it is preferable that the inductance L1 and the inductance L2 be magnetically coupled as indicated by an arrow M.

Figure 4:
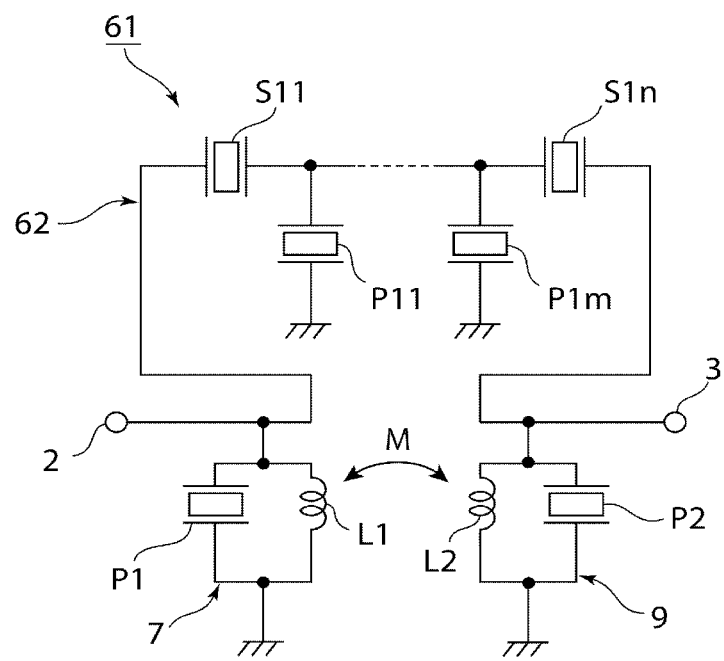
FIG. 4 is a circuit diagram of a filter device according to a third preferred embodiment of the present invention.

FIG. 4 is a circuit diagram of a filter device according to a third preferred embodiment of the present invention. In a filter device 61, the first and second LC parallel resonance circuits 7 and 9 have the same configurations as those in the second preferred embodiment. Accordingly, the same reference numerals denote the same constituent elements and description thereof is omitted.

The third preferred embodiment is different from the second preferred embodiment in a point that a ladder filter circuit 62 is connected instead of the elastic wave resonator 21. The ladder filter circuit 62 includes a plurality of serial arm resonators S11 to S1$n$ (note that n is a positive integer) arranged on a serial arm connecting the input terminal 2 and the output terminal 3 and parallel arm resonators P11 to P1$m$ (note that m is a positive integer).

Thus, the plurality of elastic wave resonators may be connected between the first LC parallel resonance circuit 7 and the second LC parallel resonance circuit 9, and it is desirable that the plurality of elastic wave resonators configure the ladder filter circuit 62 as in the present preferred embodiment.

Figure 5A:
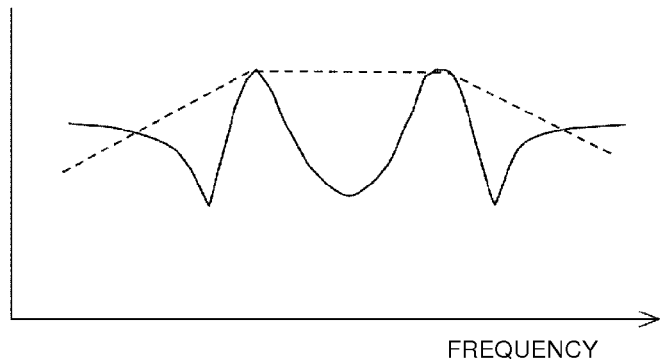
FIG. 5A is a graph for explaining attenuation-frequency characteristics of a ladder circuit portion and an LC filter portion.
Figure 5B:
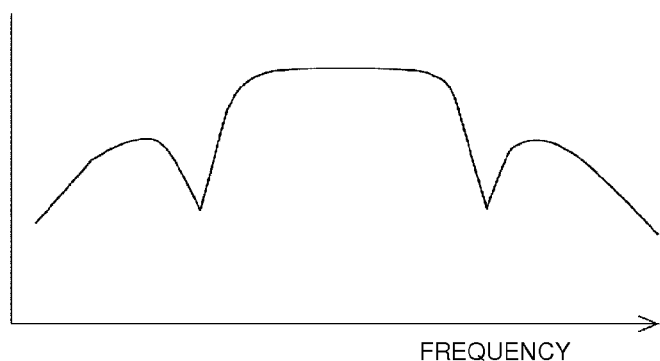
FIG. 5B is a graph illustrating attenuation-frequency characteristics of the filter device in the third preferred embodiment of the present invention.

In the present preferred embodiment, the filter characteristics of the LC filter by the first and second LC parallel resonance circuits 7 and 9 preferably are used. The solid line in FIG. 2A(a) indicates attenuation-frequency characteristics of an existing LC filter in which the elastic wave resonator 21 illustrated in the schematic block diagram of FIG. 2A is a capacitor, and a solid line in FIG. 5A indicates filter characteristics of the ladder filter circuit 62. FIG. 5B illustrates the attenuation-frequency characteristics of the filter device in the present preferred embodiment, which includes the ladder filter circuit 62 configured by the plurality of elastic wave resonators. As the attenuation-frequency characteristics are compared referring to FIG. 5B and FIG. 5A, it is confirmed that 1) widening of the band and 3) increase of the attenuation in the attenuation band separated from the pass band are achieved in the present preferred embodiment.

In addition, the ladder filter circuit 62 is provided to increase the attenuation in the vicinity of the pass band. To be more specific, the resonant frequencies of the parallel arm resonators P11 to P1$m$ of the ladder filter circuit 62 are made to match the attenuation pole located at an outside of the pass band of the filter device 61 at the low-frequency region side, and the anti-resonant frequencies thereof are located in the pass band of the filter device 61. The resonant frequencies of the serial arm resonators S11 to S1$n$ are located in the pass band of the filter device 61 at the high-frequency region side, and the anti-resonant frequencies thereof are set to the attenuation pole located at an outside of the pass band at the high-frequency region side. With this, the ladder filter circuit 62 having the attenuation poles in the frequency bands in the vicinity of the end portions of the pass band of the filter device 61 at the low-frequency region side and the high-frequency region side as the attenuation-frequency characteristics of the ladder filter circuit 62 as indicated by the solid line in FIG. 5A are obtained. In the frequency band lower than the anti-resonant frequencies of the parallel arm resonators and higher than the resonant frequencies of the serial arm resonators, the filter device 61 having low attenuation at the center and a wide pass band are obtained using the filter characteristics as the LC filter obtained by the configuration of the capacitive properties of the parallel arm and serial arm resonators of the ladder filter circuit 62 and the first and second LC parallel resonance circuits 7 and 9.

Accordingly, with the configuration of the filter device 61, the attenuation-frequency characteristics as illustrated in FIG. 5B in which the center frequency of the pass band is approximately 2.6 GHz, the band width of the pass band is approximately 200 MHz, the attenuation is approximately 30 dB at the frequency of approximately 2.4 GHZ in the vicinity of the pass band at the low-frequency region side, and the attenuation is approximately 50 dB at the frequency of approximately 2.8 GHZ in the vicinity of the pass band at the high-frequency region side are obtained by combining the filter characteristics of the first and second LC parallel resonance circuits 7 and 9 and the filter characteristics of the ladder filter circuit 62 having the attenuation poles in predetermined frequency bands. That is to say, as illustrated in FIG. 5B, in the present preferred embodiment, 1) widening of the band, 2) increase of the attenuation in the vicinity of the pass band, and 3) increase of the attenuation in the attenuation band separated from the pass band are achieved.

Figure 5C:
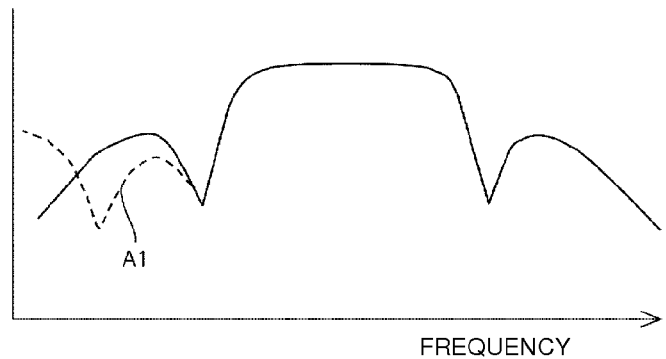
FIG. 5C is a graph illustrating attenuation-frequency characteristics of the filter device when positive magnetic coupling is formed in the third preferred embodiment of the present invention.

Further, in a variation of the third preferred embodiment of the present invention, when the inductance L1 and the inductance L2 generate positive magnetic coupling, as indicated by a dashed line A1 in FIG. 5C, the attenuation pole by the magnetic coupling is capable of being arranged at an outside of the pass band of the filter device at the low-frequency region side. On the other hand, when the inductance L1 and the inductance L2 generate negative magnetic coupling, as indicated by a dashed line A2 in FIG. 5D, the attenuation pole by the magnetic coupling is capable of being arranged at an outside of the pass band of the filter device at the high-frequency region side. The attenuation pole by the magnetic coupling, which is arranged at the outside of the pass band at the low-frequency region side or the high-frequency region side, further increases the attenuation at the outside of the pass band in comparison with the case where the magnetic coupling is not generated. When an electric current I1 of an angular frequency ω flows through the inductance L1, an electric current I2 of the angular frequency ω is generated in the inductance L2 arranged in the vicinity of the inductance L1 by mutual inductance. When a mutual relationship such that the generated magnetic flux strengthens each other is established between the inductance L1 and the inductance L2, that is, when a value of M is positive in the following equation 1 and the following equation 2 under an assumption that a voltage of the inductance L1 is taken as V1 and a voltage of the inductance L2 is taken as V2, it is considered that positive magnetic coupling is generated. In contrast, when a mutual relationship such that the generated magnetic flux weakens each other is established between the inductance L1 and the inductance L2, that is, when the value of M is negative in the following equation 1 and the following equation 2, it is considered that negative magnetic coupling is generated.

$$V1 = j\omega L1 I1 + j\omega M I2 \quad \text{(Equation 1)}$$

$$V2 = j\omega M I1 + j\omega L2 I2 \quad \text{(Equation 2)}$$

Figure 6:
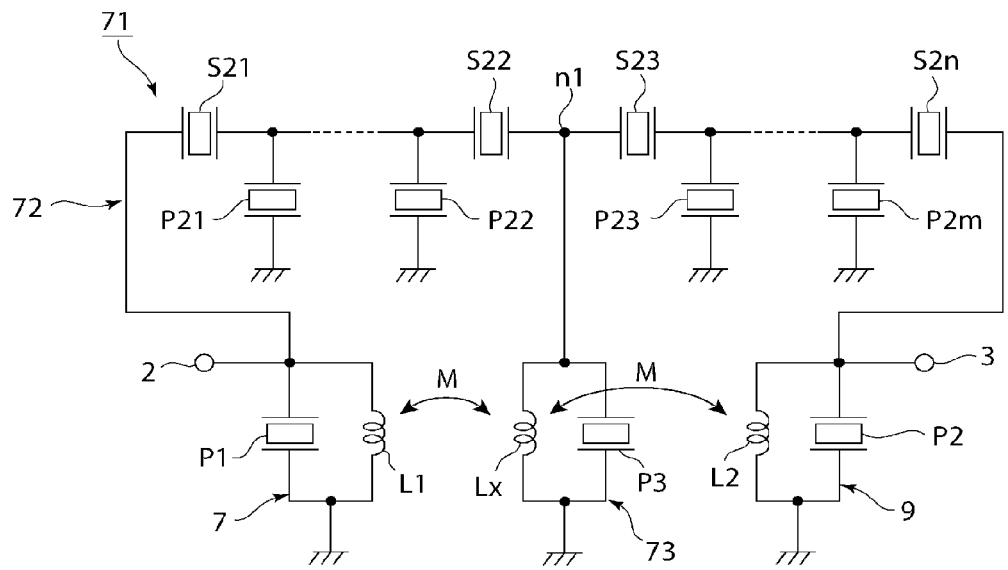
FIG. 6 is a circuit diagram of a filter device according to a fourth preferred embodiment of the present invention.

FIG. 6 is a circuit diagram of a filter device according to a fourth preferred embodiment of the present invention. A filter device 71 includes the first LC parallel resonance circuit 7 connected to the input terminal 2 and the second LC parallel resonance circuit 9 connected to the output terminal 3. In addition, a ladder filter circuit 72 is connected between the first LC parallel resonance circuit 7 and the second LC parallel resonance circuit 9. The ladder filter circuit 72 includes a plurality of serial arm resonators S21 to S2$n$ (note that n is a positive integer) and a plurality of parallel arm resonators P21 to P2$m$ (note that m a positive integer). Also in the present preferred embodiment, the first LC parallel resonance circuit 7 and the second LC parallel resonance circuit 9 have the same configurations as those in the third preferred embodiment. The ladder filter circuit 72 also has the same configuration as that of the ladder filter circuit 62.

Moreover, in the present preferred embodiment, a third LC parallel resonance circuit 73 is connected between a connection point n1 between the serial arm resonator S22 and the serial arm resonator S23 and the ground potential. The third LC parallel resonance circuit 73 includes an inductance Lx and an elastic wave resonator P3 connected in parallel with the inductance Lx.

In the present preferred embodiment, the filter characteristics of the LC filter are obtained using not only the first and second LC parallel resonance circuits 7 and 9 but also the third LC parallel resonance circuit 73. Thus, in addition to the first and second LC parallel resonance circuits 7 and 9, equal to or more than one third LC parallel resonance circuit(s) connected to the ground may be connected between the first and second LC parallel resonance circuits 7 and 9.

In the present preferred embodiment, the attenuation pole at the low-frequency region side is defined by the resonant frequencies of the parallel arm resonators P21 to P2$m$ of the ladder filter circuit 72. Further, the attenuation pole at the high-frequency region side is defined by the anti-resonant frequencies of the serial arm resonators S21 to S2$n$.

Accordingly, also in the present preferred embodiment, 1) widening of the band, 2) increase of the attenuation in the vicinity of the pass band, and 3) increase of the attenuation in the attenuation band separated from the pass band are achieved.

It should be noted that in contrast to the above-mentioned case, the attenuation pole at the high-frequency region side may be defined by the resonant frequencies of the parallel arm resonators P21 to P2$m$ of the ladder filter circuit 72, and the attenuation pole at the low-frequency region side may be defined by the anti-resonant frequencies of the serial arm resonators S21 to S2$n$.

Figure 5D:
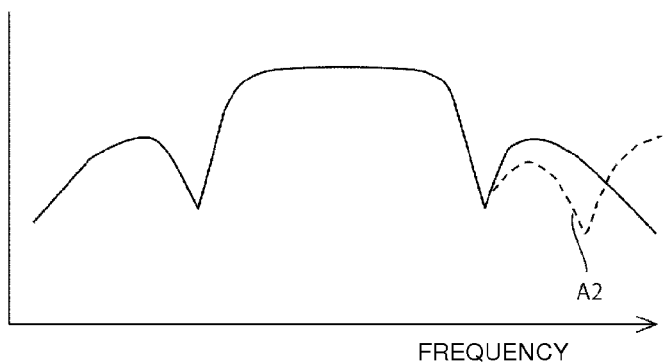
FIG. 5D is a graph illustrating attenuation-frequency characteristics of the filter device when negative magnetic coupling is formed in the third preferred embodiment of the present invention.

Also in the present preferred embodiment, preferably as indicated by arrows M, it is desirable for the inductance L1 and the inductance Lx to be magnetically coupled and the inductance Lx and the inductance L2 to be magnetically coupled. With this, the attenuation poles as indicated by the dashed line A1 in FIG. 5C and the dashed line A2 in FIG. 5D are provided at positions separated from the pass band, so that the attenuation at the positions separated from the pass band is further increased in comparison with the case where they are not magnetically coupled.

Figure 7:
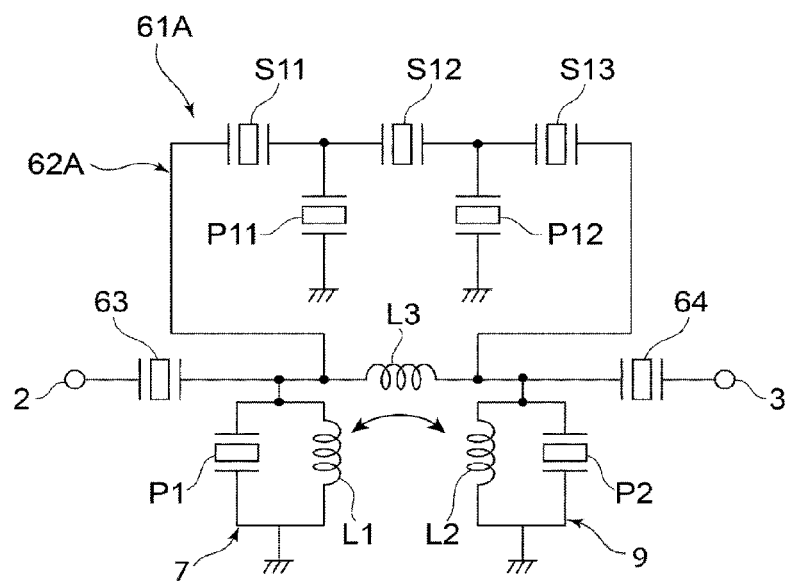
FIG. 7 is a circuit diagram of a filter device according to a variation of the third preferred embodiment of the present invention.

FIG. 7 is a circuit diagram according to a variation of the above-mentioned third preferred embodiment. In a filter device 61A in the variation, the same reference numerals as those in FIG. 4 denote the same constituent elements thereof and description thereof is omitted. In the filter device 61A in the variation, a ladder filter circuit 62A includes the serial arm resonators S11 to S13 and the parallel arm resonators P11 and P12. An elastic wave resonator 63 is connected between the input terminal 2 and the first LC parallel resonance circuit 7. An elastic wave resonator 64 is also connected between the output terminal 3 and the second LC parallel resonance circuit 9. The elastic wave resonators 63 and 64 have anti-resonant frequencies at the high-frequency region side relative to the pass band. This increases the attenuation at an outside of the pass band at the high-frequency region side. In addition, a configuration to adjust the impedance of the filter device 61A is also included.

Moreover, an inductance L3 is connected between the first LC parallel resonance circuit 7 and the second LC parallel resonance circuit 9. Further, the inductance L1 and the inductance L2 are magnetically coupled.

Figure 8:
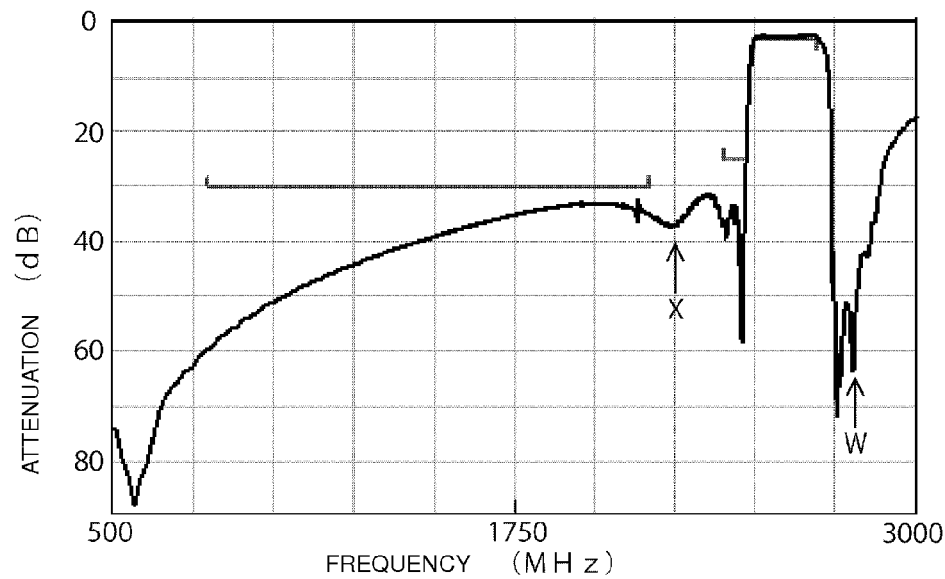
FIG. 8 is a graph illustrating attenuation-frequency characteristics in the variation as illustrated in FIG. 7.

FIG. 8 is a graph illustrating the attenuation-frequency characteristics of the filter device 61A in the variation. In the variation, filter characteristics used for a filter satisfying the BAND41 standard of the universal mobile telecommunications system (UMTS), for example, are obtained. In this case, the pass band preferably is from 2496 MHz to 2690 MHz, and the bands in which large attenuation is desired to be ensured are a band of 2400 MHz to 2473 MHz in the IMS band of 2.4 GHz and a band of 800 MHz to 2170 MHz in the UMTS band, for example. As seen in FIG. 8, widening of the band and increase of the attenuation in the vicinity of the pass band is achieved.

Further, because the elastic wave resonators 63 and 64 are provided, the attenuation pole appears at a position as indicated by an arrow W in FIG. 8. With this, the attenuation at the position separated from the pass band is increased and the impedance of the filter circuit is adjusted.

A resonant frequency Fx that is generated by resonance among the equivalent inductance due to the magnetic coupling between the inductance L1 and the inductance L2, the inductance L3, and a capacitive component of the ladder circuit, appears at a position indicated by an arrow X at the low-frequency region side relative to the pass band. Accordingly, the attenuation is increased at the position indicated by the arrow X.

Figure 9:
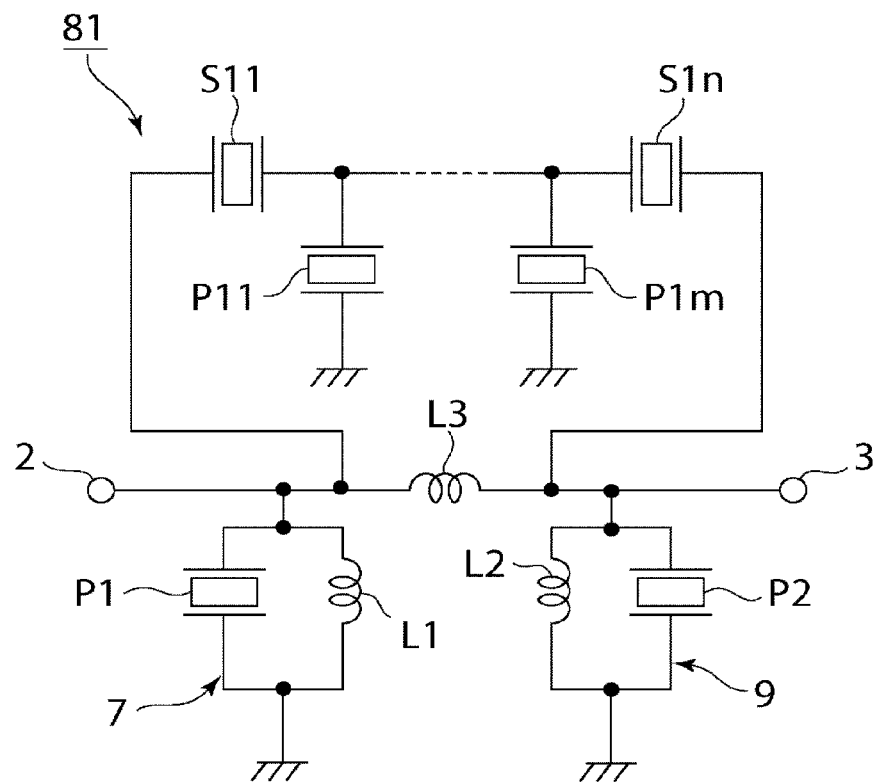
FIG. 9 is a circuit diagram of a filter device according to a fifth preferred embodiment of the present invention.

FIG. 9 is a circuit diagram of a filter device according to a fifth preferred embodiment of the present invention. A filter device 81 in the fifth preferred embodiment corresponds to the variation of the filter device 61 in the third preferred embodiment. The filter device 81 is different from the filter device 61 in the third preferred embodiment in a point that the first inductance L1 and the second inductance L2 are connected to the third inductance L3 connected between the first and second LC parallel resonance circuits 7 and 9. That is to say, one end of the third inductance L3 is connected to one end of the inductance L1 and the other end of the inductance L3 is connected to one end of the inductance L2. With this, a circuit with a delta-shaped configuration is provided.

Thus, the third inductance L3 may be connected instead of the magnetic coupling between the inductance L1 and the inductance L2. That is to say, a circuit with a delta-shaped configuration that is equivalent to the circuit in which the first and second inductances L1 and L2 are magnetically coupled may be used.

Figure 10:
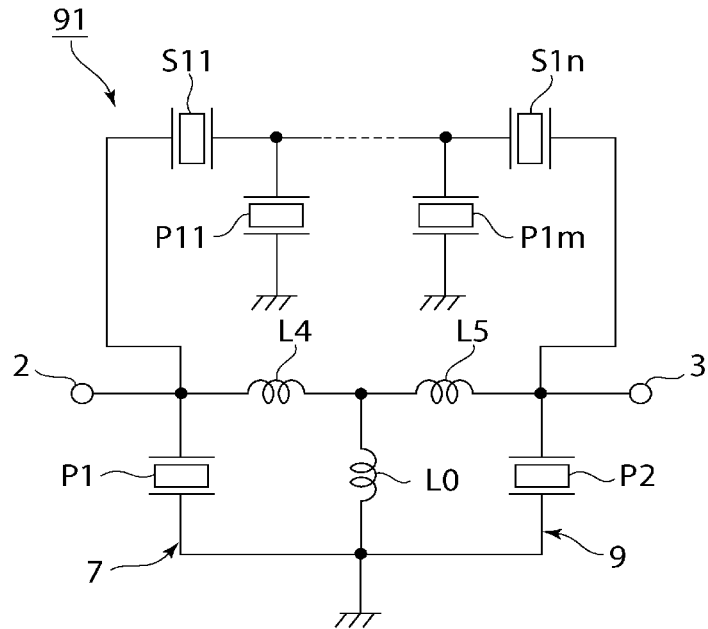
FIG. 10 is a circuit diagram of a filter device according to a sixth preferred embodiment of the present invention.

FIG. 10 is a circuit diagram illustrating a filter device according to a sixth preferred embodiment of the present invention. A filter device 91 in the present preferred embodiment also corresponds to the variation of the filter device 61 in the third preferred embodiment. In the filter device 91, the first inductance L1 and the second inductance L2 are made common and a common inductance L0 is used. That is to say, the elastic wave resonator P1 and the inductance L0 configure the first LC parallel resonance circuit 7 and the inductance L0 and the elastic wave resonator P2 configure the second LC parallel resonance circuit 9. A fourth inductance L4 is connected between the inductance L0 and the input terminal. A fifth inductance L5 is connected between one end of the inductance L0 and the output terminal. The inductances L0, L4, and L5 configure a three-element Y type circuit. The Y type circuit of this kind is equivalent to a circuit in which the inductances L1 and L2 are magnetically coupled. That is, the Y type circuit configured by the inductances L0, L4, and L5 may be used instead of the circuit with a delta-shaped configuration as illustrated in FIG. 9.

Also with the filter devices 81 and 91 as illustrated in FIG. 9 and FIG. 10, in the same manner as the filter device 61 in the third preferred embodiment, 1) widening of the band, 2) increase of the attenuation in the vicinity of the pass band, and 3) increase of the attenuation in the attenuation band separated from the pass band are achieved. In addition, the same effect as the magnetic coupling effect is achieved, so that the attenuation in the vicinity of the pass band is further increased in comparison with the case where the circuit with a delta-shaped configuration or the three-element Y type circuit is not provided.

FIG. 11 to FIG. 14 are circuit diagrams of filter devices according to seventh to tenth preferred embodiments of the present invention, respectively. These filter devices also correspond to variations of the filter device 61 in the third preferred embodiment as illustrated in FIG. 4. Accordingly, only different portions are described hereinafter.

Figure 11:
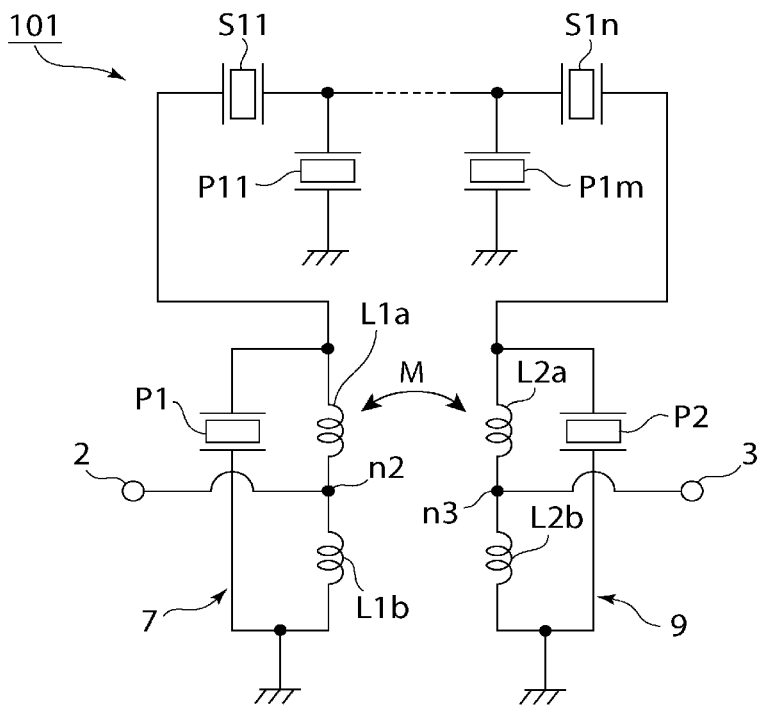
FIG. 11 is a circuit diagram of a filter device according to a seventh preferred embodiment of the present invention.

In a filter device 101 as illustrated in FIG. 11, the inductance L1 and the inductance L2 are respectively divided in series in the first LC parallel resonance circuit 7 and the second LC parallel resonance circuit 9. To be specific, the inductance L1 is divided in series so that an inductance L1a and an inductance L1b are connected in series. In the same manner, inductances L2a and L2b are connected in series also in the second LC parallel resonance circuit 9.

The input terminal 2 is connected to a connection point n2 between the inductance L1a and the inductance L1b. In the same manner, the output terminal 3 is connected to a connection point n3 between the inductance L2a and the inductance L2b. Thus, in various preferred embodiments of the present invention, the first and second inductances L1 and L2 may be divided in series.

Figure 12:
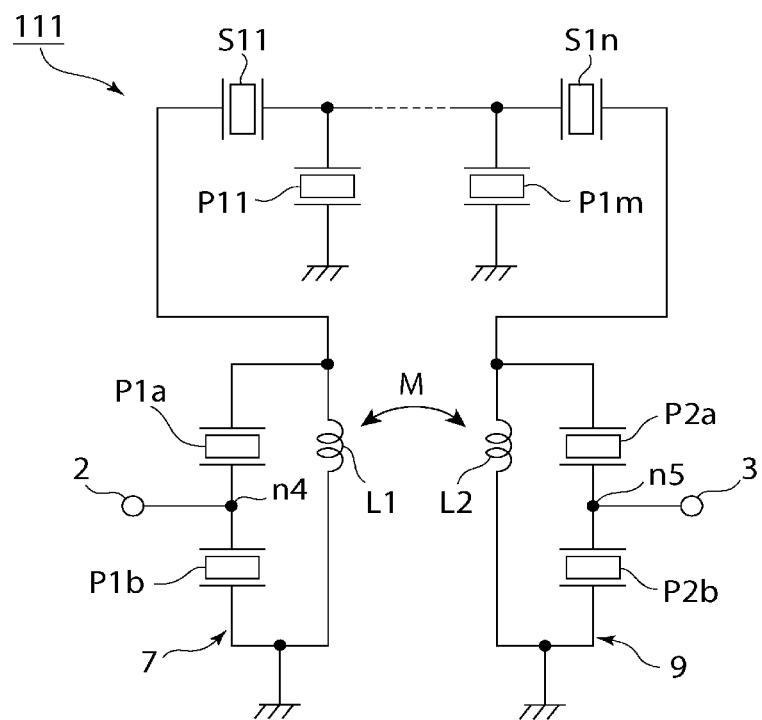
FIG. 12 is a circuit diagram of a filter device according to an eighth preferred embodiment of the present invention.

In the same manner, like a filter device 111 as illustrated in FIG. 12, the elastic wave resonators in the first and second LC parallel resonance circuits 7 and 9 may be divided in series. In FIG. 12, an elastic wave resonator P1a and an elastic wave resonator P1b are connected in series in the first LC parallel resonance circuit 7. A connection point n4 between the elastic wave resonators P1a and P1b and the input terminal 2 are connected. In the same manner, the elastic wave resonator is also divided in series in the second LC parallel resonance circuit 9. That is to say, an elastic wave resonator P2a and an elastic wave resonator P2b are connected in series. A connection point n5 between the elastic wave resonators P2a and P2b and the output terminal 3 are electrically connected.

Figure 13:
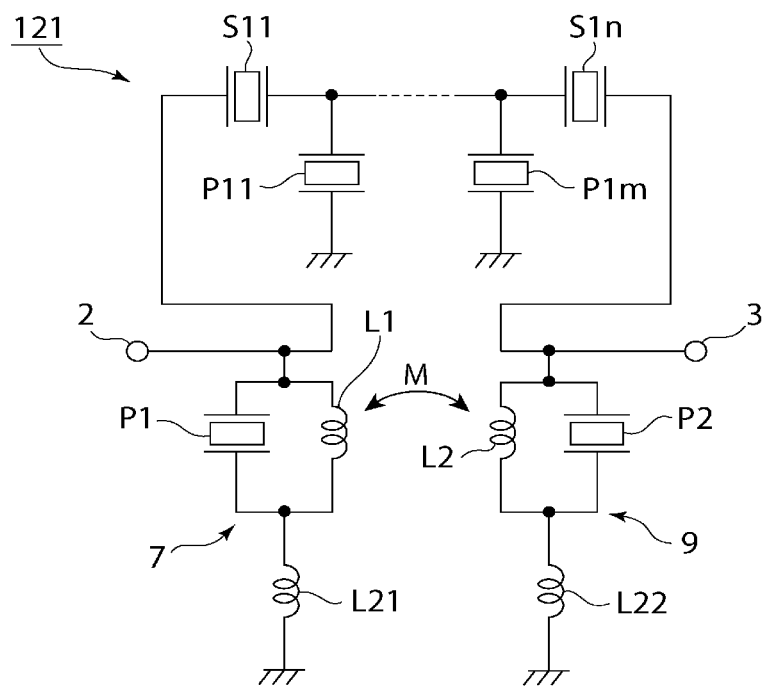
FIG. 13 is a circuit diagram of a filter device according to a ninth preferred embodiment of the present invention.

In a filter device 121 as illustrated in FIG. 13, in the first LC parallel resonance circuit 7, an inductance L21 as a sixth inductance L6 is connected between a ground potential and end portions of the elastic wave resonator P1 and the inductance L1 at the ground potential side. In the same manner, also in the second LC parallel resonance circuit 9, an inductance L22 as the inductance L6 is connected between the ground potential and end portions of the elastic wave resonator P2 and the inductance L2 at the ground potential side. In this manner, in the first and second LC parallel resonance circuits 7 and 9, the inductances L21 and L22 may be further connected between the ground potential and the end portions of the parallel circuit portions at the ground potential side. This further increases the attenuation in the vicinity of the pass band.

Figure 14:
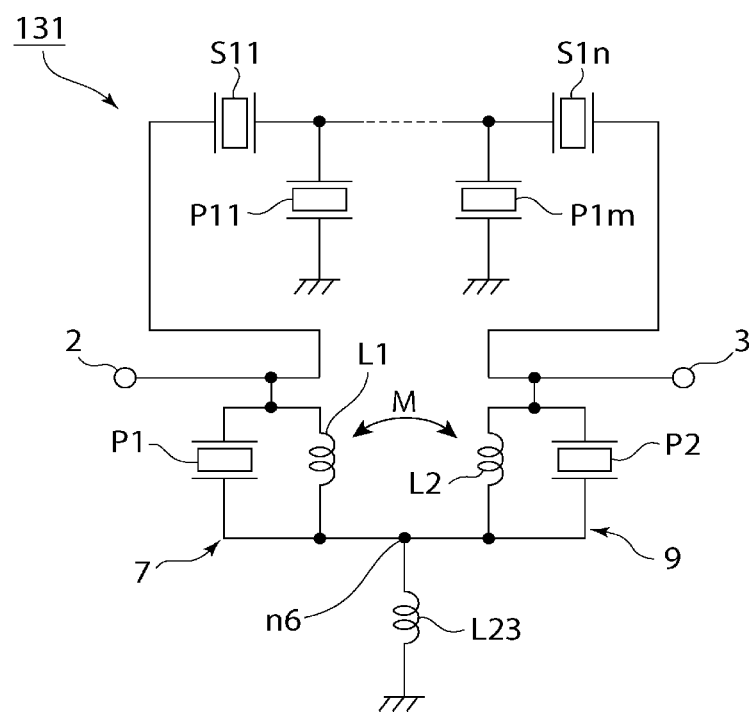
FIG. 14 is a circuit diagram of a filter device according to a tenth preferred embodiment of the present invention.

In a filter device 131 as illustrated in FIG. 14, end portions of the first LC parallel resonance circuit 7 and the second LC parallel resonance circuit 9 at the ground potential side are commonly connected. An inductance L23 as the sixth inductance L6 is connected between a common connection point n6 thereof and the ground potential. The connection of the inductance L23 further increases the attenuation in the vicinity of the pass band.

Although in the first to tenth preferred embodiments of the present invention, the inductance of the first LC parallel resonance circuit 7 and the inductance of the second LC parallel resonance circuit 9 preferably are magnetically coupled, they may not be necessarily magnetically coupled.

The elastic wave resonators used for the first and second LC parallel resonance circuits 7 and 9 are not limited to surface acoustic wave resonators; and boundary acoustic wave resonators, resonators using bulk acoustic waves, or the like may be used.

In the second to tenth preferred embodiments of the present invention, as in the first preferred embodiment, capacitors C may be used like in the first preferred embodiment instead of the elastic wave resonators in the first and second LC parallel resonance circuits 7 and 9. Also in this case, the attenuation in the vicinity of the pass band is increased by the filter characteristics of the LC filter and at least one elastic wave resonator that is connected between the first and second LC parallel resonance circuits.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   an input terminal;
   an output terminal;
   a line connecting the input terminal and the output terminal;
   a first LC parallel resonance circuit connected between the line and a ground potential and including a first inductance;
   a second LC parallel resonance circuit connected between the line and the ground potential and including a second inductance; and
   at least one elastic wave resonator connected between an end portion of the first LC parallel resonance circuit at a line side and an end portion of the second LC parallel resonance circuit at the line side; wherein
   the first and second LC parallel resonance circuits are electrically coupled by a capacitive property of the at least one elastic wave resonator;
   attenuation-frequency characteristics of an LC filter defined by the first and second LC parallel resonance circuits and the capacitive property of the at least one elastic wave resonator, and attenuation-frequency characteristics defined by an anti-resonance point of the at least one elastic wave resonator are combined; and
   the first inductance included in the first LC parallel resonance circuit and the second inductance included in the second LC parallel resonance circuit are magnetically coupled.

2. The filter device according to claim 1, wherein the at least one elastic wave resonator connected between the first LC parallel resonance circuit and the second LC parallel resonance circuit includes a plurality of elastic wave resonators and the plurality of elastic wave resonators configure a ladder filter circuit.

3. The filter device according to claim 1, wherein
   the first and second LC parallel resonance circuits are respectively defined by the first and second inductances and second and third elastic wave resonators connected in parallel with the first and second inductances; and
   capacitive properties of the second and third elastic wave resonators configure capacitors of the first and second LC parallel resonance circuits, respectively.

4. The filter device according to claim 1, wherein a circuit portion in which the first inductance in the first LC parallel resonance circuit and the second inductance in the second LC parallel resonance circuit are magnetically coupled is configured by a circuit with a delta-shaped configuration including the first inductance, the second inductance, and a third inductance connecting one end of the first inductance and one end of the second inductance.

5. The filter device according to claim 1, wherein a circuit portion in which the first inductance in the first LC parallel resonance circuit and the second inductance in the second LC parallel resonance circuit are magnetically coupled is configured by a three-element Y circuit including a common inductance defining the first inductance and the second inductance, a third inductance connected to a connection point between an end portion of the common inductance at a side opposite to a ground potential and the input terminal, and a fourth inductance connected between the connection point and the output terminal.

6. The filter device according to claim 1, wherein each of the first inductance and the second inductance in the first and second LC parallel resonance circuits is divided in series into a plurality of inductances.

7. The filter device according to claim 1, wherein each of the first and second capacitors in the first LC parallel resonance circuit and the second LC parallel resonance circuit is defined by a plurality of elastic wave resonators connected in series.

8. The filter device according to claim 1, wherein another inductance is connected between a ground potential and an end portion of at least one LC parallel resonance circuit of the first and second LC parallel resonance circuits at the ground potential side.

9. The filter device according to claim 1, wherein the at least one elastic wave resonator is a surface acoustic wave resonator.

10. The filter device according to claim 1, wherein the at least one elastic wave resonator is a resonator configured to use bulk acoustic waves.

11. The filter device according to claim 10, wherein each of the first inductance and the second inductance in the first and second LC parallel resonance circuits is divided in series into a plurality of inductances.

12. The filter device according to claim 10, wherein each of the first and second capacitors in the first LC parallel resonance circuit and the second LC parallel resonance circuit is defined by a plurality of elastic wave resonators connected in series.

13. A filter device comprising:
    an input terminal;
    an output terminal;
    a line connected to the input terminal and the output terminal;
    a first LC parallel resonance circuit connected between the line and a ground potential, including a first inductance, and having a first parallel resonant frequency;
    a second LC parallel resonance circuit connected between the line and the ground potential, including a second inductance, and having a second parallel resonant frequency; and
    a filter circuit including at least one elastic wave resonator connected to an end portion of the first LC parallel resonance circuit at a line side and an end portion of the second LC parallel resonance circuit at the line side; wherein
    first resonance characteristics of the first LC parallel resonance circuit, second resonance characteristics of the second LC parallel resonance circuit, and a capacitive property of the at least one elastic wave resonator cause the first and second resonance characteristics to be electrically coupled so as to define pass band characteristics of an LC filter;
    a pass band of the LC filter is located in a frequency region that is lower than an anti-resonant frequency of the at least one elastic wave resonator or higher than a resonant frequency of the at least one elastic wave resonator, and the first parallel resonant frequency and the second parallel resonant frequency are arranged in the pass band of the LC filter; and
    an attenuation pole of the filter circuit including the at least one elastic wave resonator is located in an attenuation region at an outside of the pass band of the LC filter.

14. The filter device according to claim 13, wherein the first inductance included in the first LC parallel resonance circuit and the second inductance included in the second LC parallel resonance circuit are magnetically coupled.

15. The filter device according to claim 14, wherein a circuit portion in which the first inductance in the first LC parallel resonance circuit and the second inductance in the second LC parallel resonance circuit are magnetically coupled is configured by a circuit with a delta-shaped configuration including the first inductance, the second inductance, and a third inductance connecting one end of the first inductance and one end of the second inductance.

16. The filter device according to claim 14, wherein a circuit portion in which the first inductance in the first LC parallel resonance circuit and the second inductance in the second LC parallel resonance circuit are magnetically coupled is configured by a three-element Y circuit including a common inductance defining the first inductance and the second inductance, a third inductance connected to a connection point between an end portion of the common inductance at a side opposite to a ground potential and the input terminal, and a fourth inductance connected between the connection point and the output terminal.

17. The filter device according to claim 13, wherein the at least one elastic wave resonator connected between the first LC parallel resonance circuit and the second LC parallel resonance circuit includes a plurality of elastic wave resonators and the plurality of elastic wave resonators configure a ladder filter circuit.

18. The filter device according to claim 13, wherein
the first and second LC parallel resonance circuits are respectively defined by the first and second inductances and second and third elastic wave resonators connected in parallel with the first and second inductances; and
capacitive properties of the second and third elastic wave resonators configure capacitors of the first and second LC parallel resonance circuits, respectively.

19. The filter device according to claim 13, wherein another inductance is connected between a ground potential and an end portion of at least one LC parallel resonance circuit of the first and second LC parallel resonance circuits at the ground potential side.

20. The filter device according to claim 13, wherein the at least one elastic wave resonator is a surface acoustic wave resonator.

21. The filter device according to claim 13, wherein the at least one elastic wave resonator is a resonator configured to use bulk acoustic waves.

* * * * *